(12) United States Patent
Kim

(10) Patent No.: US 8,976,583 B2
(45) Date of Patent: Mar. 10, 2015

(54) NON-VOLATILE SEMICONDUCTOR MEMORY DEVICE AND READING METHOD THEREOF

(75) Inventor: Hyung-Seok Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 224 days.

(21) Appl. No.: 13/605,779

(22) Filed: Sep. 6, 2012

(65) Prior Publication Data

US 2013/0308380 A1  Nov. 21, 2013

(30) Foreign Application Priority Data

May 21, 2012  (KR) .................. 10-2012-0053668

(51) Int. Cl.
*G11C 11/34* (2006.01)
*G11C 16/04* (2006.01)

(52) U.S. Cl.
USPC ............. 365/185.03; 365/185.17; 365/185.2; 365/185.11

(58) Field of Classification Search
CPC .......... G11C 16/0483; G11C 16/3418; G11C 16/3427; G11C 29/24; G11C 11/4099
USPC ............ 365/185.17, 185.02, 185.11, 185.18, 365/185.03, 185.09, 185.05, 185.2, 206; 29/830
See application file for complete search history.

(56) References Cited

U.S. PATENT DOCUMENTS

| 5,402,380 A | 3/1995 | Kumakura et al. |
| 6,295,227 B1 * | 9/2001 | Sakui et al. ............. 365/185.17 |
| 6,563,743 B2 | 5/2003 | Hanzawa et al. |
| 2009/0244967 A1 * | 10/2009 | Kim et al. .................. 365/185.2 |
| 2012/0236644 A1 * | 9/2012 | Futatsuyama ............ 365/185.11 |

FOREIGN PATENT DOCUMENTS

KR  1020100023280  3/2010

* cited by examiner

*Primary Examiner* — Richard Elms
*Assistant Examiner* — Ajay Ojha
(74) *Attorney, Agent, or Firm* — IP & T Group LLP

(57) ABSTRACT

Provided are a semiconductor memory device has improved read disturbance characteristics as well as improved retention characteristics at a high temperature, and a reading method thereof. The non-volatile semiconductor memory device includes at least one bit line; and a cell string configured to be coupled with the bit line respectively, and include normal memory cells and dummy memory cells that are alternately coupled with each other, where normal data are programmed and read to and from the normal memory cells, and dummy memory cells are programmed with dummy data.

17 Claims, 5 Drawing Sheets

NON-VOLATILE SEMICONDUCTOR MEMORY DEVICE AND READING METHOD THEREOF

CROSS-REFERENCE TO RELATED APPLICATIONS

The present application claims priority of Korean Patent Application No. 10-2012-0053668, filed on May 21, 2012, which is incorporated herein by reference in its entirety.

BACKGROUND

1. Field

Exemplary embodiments of the present invention relate to a semiconductor designing technology, and more particularly, to a non-volatile semiconductor memory device and a reading method of the non-volatile semiconductor memory device.

2. Description of the Related Art

Semiconductor memory devices are generally divided into two groups: volatile memory devices, including Dynamic Random Access Memory (DRAM) devices and Synchronous Random Access Memory (SRAM) devices; and non-volatile memory devices, including Electrically Erasable Programmable Read Only Memory (EEPROM) devices, Ferroelectric Random Access Memory (FRAM) devices, Phase-change Random Access Memory (PRAM) devices, Magnetic Random Access Memory (MRAM) devices, and flash memory devices. Whereas the volatile memory devices lose the data stored therein when power supply is cut off, the non-volatile memory devices retain the data stored therein even though power supply is cut off. Particularly, since flash memory devices have such advantages as high programming speed, low power consumption, and large-capacity data storage, they are widely used as storage media for computer systems.

Flash memory devices are generally divided into NAND-type flash memory devices and NOR-type flash memory devices. Since the NOR-type flash memory devices have a structure where each memory cell is independently coupled with a bit line and a word line, the NOR-type flash memory devices have excellent random access time characteristics. On the other hand, the NAND-type flash memory devices include a plurality of memory cells coupled in series. Only one contact is required for each cell string. Therefore, the NAND-type flash memory devices may have a high integration degree. For this reason, usually the NAND-type flash memory devices are used as high-integration non-volatile memory devices.

FIG. 1 is a schematic view illustrating a conventional NAND-type flash memory device.

Referring to FIG. 1, the conventional NAND-type flash memory device 10 includes a memory cell array 12 and an input/output control circuit 14. The memory cell array 12 programs data that are transferred through bit lines EVEN_BL and ODD_BL, or provides programmed data through the bit lines EVEN_BL and ODD_BL. The input/output control circuit 14 transfers external data to be programmed through the bit lines EVEN_BL and ODD_BL, or outputs data received from the bit lines EVEN_BL and ODD_BL to the outside of the NAND-type flash memory device 10.

The memory cell array 12 includes a first cell string ST1 and a second cell string ST2. Each of the first cell string ST1 and the second cell string ST2 has its one end coupled with a bit line, EVEN_BL or ODD_BL, and the other end coupled with a common source line CSL. For the illustrative purpose, it is assumed that the memory cell array 12 includes two cell strings, which are the first cell string ST1 and the second cell string ST2, and the bit lines EVEN_BL and ODD_BL respectively coupled with the first cell string ST1 and the second cell string ST2 are referred to as a first bit lines EVEN_BL and a second bit lines ODD_BL. A first switch SW1 and a second switch SW2 are disposed on both ends of each of the first cell string ST1 and the second cell string ST2 A plurality of memory cells MC0 to MCM are serially coupled with each other between the first switch SW1 and the second switch SW2. The first switch SW1 is coupled with a drain selection line DSL. The first switch SW1 selectively connects, or disconnects, a memory cell MCM to, or from, the bit line EVEN_BL or ODD_BL, according to the voltage level of the drain selection line DSL. The second switch SW2 is coupled with a source selection line SSL. The second switch SW2 selectively connects, or disconnects, a memory cell MC0 to, or from, the common source line CSL, according to the voltage level of the source selection line SSL. Also, the memory cells MC0 to MCM are coupled with a plurality of word lines WL0 to WLM in one-on-one. Data are programmed or read according to the voltage level that is applied to the word lines WL0 to WLM.

Meanwhile, the input/output control circuit 14 includes a page buffer (not shown) and an input/output circuit (not shown). The page buffer latches a data to be programmed or a data to be read. The input/output circuit serves as an interface between the page buffer and the outside. The technologies of the page buffer and the input/output circuit are well known and used, so detailed description about the page buffer and the input/output circuit is not provided herein.

The NAND-type flash memory device 10 having the above-described structure may have an excellent integration degree. The NAND-type flash memory device 10, however, has the following drawbacks, which are described hereafter with reference to FIGS. 2A to 2D.

FIGS. 2A and 2B illustrate memory cells to describe the concern originating from retention characteristics at a high temperature, whereas FIGS. 2C and 2D illustrate memory cells to describe the concern originating from read disturbance.

Referring to FIG. 2A, when memory cells MCX−1 and MCX+1 that are adjacent to a memory cell MCX programmed with a data is in an erase state, mobile ions included in electrical charges move to the surrounding area of the programmed memory cell MCX due to a field between floating gates. As a result, the threshold voltage VT of the programmed memory cell MCX is changed, for example, dropped. Retention characteristics are deteriorated. On the other hand, as illustrated in FIG. 2B, when the memory cells MCX−1 and MCX+1 that are adjacent to the programmed memory cell MCX is in a program state, the mobile ions in the surrounding region do not move, deteriorating the retention characteristics.

Subsequently, the drawback originating from read disturbance is described with reference to FIG. 2C. During a read operation, a read voltage SEL_BIAS, which is lower than a read pass voltage VREAD to be described later, is applied to a word line WLX coupled with the selected memory cell MCX, while the read pass voltage VREAD, which is higher than the threshold voltage VT of the memory cells MCX−1 and MCX+1, is applied to word lines WLX−1, WLX+1, and WLX+2 coupled with the unselected memory cells MCX−1 and MCX+1. Herein, when the memory cells MCX−1 and MCX+1 that are adjacent to the programmed memory cell MCX is in an erase state, the read pass voltage VREAD and the potential of the erase-state memory cells MCX−1 and MCX+1 are added up and the lateral field works on the selected memory cell MCX. As a result, there may be a concern in that a charge loss phenomenon may occur in the selected memory cell MCX due to the lateral field. On the other hand, as illustrated in FIG. 2D, when the memory cells MCX−1 and MCX+1 that are adjacent to the selected memory cell MCX is in a program state, the lateral field decreases because the programmed memory cells MCX−1 and MCX+1 have negative potential and then the lateral field by the read pass voltage VREAD attenuates.

Meanwhile, the above concerns become more serious in case of a memory cell block programmed with a system firmware data. A system firmware data is not information used by a memory but information used by a controller to operate the memory. Since the system firmware data is continuously read out whenever the memory operates after the memory is programmed once, the above-mentioned concerns may appear more distinctively when the memory cell block is a memory cell block programmed with the system firmware data.

SUMMARY

An embodiment of the present invention is directed to a semiconductor memory device having improved read disturbance characteristics as well as improved retention characteristics at a high temperature, and a reading method thereof.

In accordance with an embodiment of the present invention, a non-volatile semiconductor memory device includes a cell string unit including normal memory cells and dummy memory cells that are alternately coupled with each other, wherein normal data are programmed to and read from the normal memory cells, while dummy data are programmed in dummy memory cells.

In accordance with another embodiment of the present invention, a non-volatile semiconductor memory device includes: first and second cell strings each including normal memory cells and dummy memory cells alternately coupled with each other, where normal data are programmed to and read from the normal memory cells while the dummy data are programmed in dummy memory cells; a first bit line coupled with one end of the first cell string; a second bit line coupled with one end of the second cell string; a common source line coupled with the other ends of the first and second cell strings in common; and a common page buffer for selecting one between the first bit line and the second bit line.

In accordance with yet another embodiment of the present invention, a reading method of a non-volatile semiconductor memory device having a cell string structure where normal memory cells for storing and providing normal data and dummy memory cells for storing dummy data are alternately disposed includes performing a sequence of selecting one of the normal memory cells to be read, applying a read voltage to a selected normal memory cell, and applying a read pass voltage to unselected normal memory cells and the dummy memory cells, while each of the normal memory cells, not the dummy memory cells, outputs stored data.

In accordance with another embodiment of the present invention, a non-volatile semiconductor memory device comprises a plurality of string units, each for storing multi-bit data, wherein the string unit comprises a plurality of normal cells and a plurality of dummy cells, each located between every two normal cells, connected in series to each other

DETAILED DESCRIPTION

Figure 1:
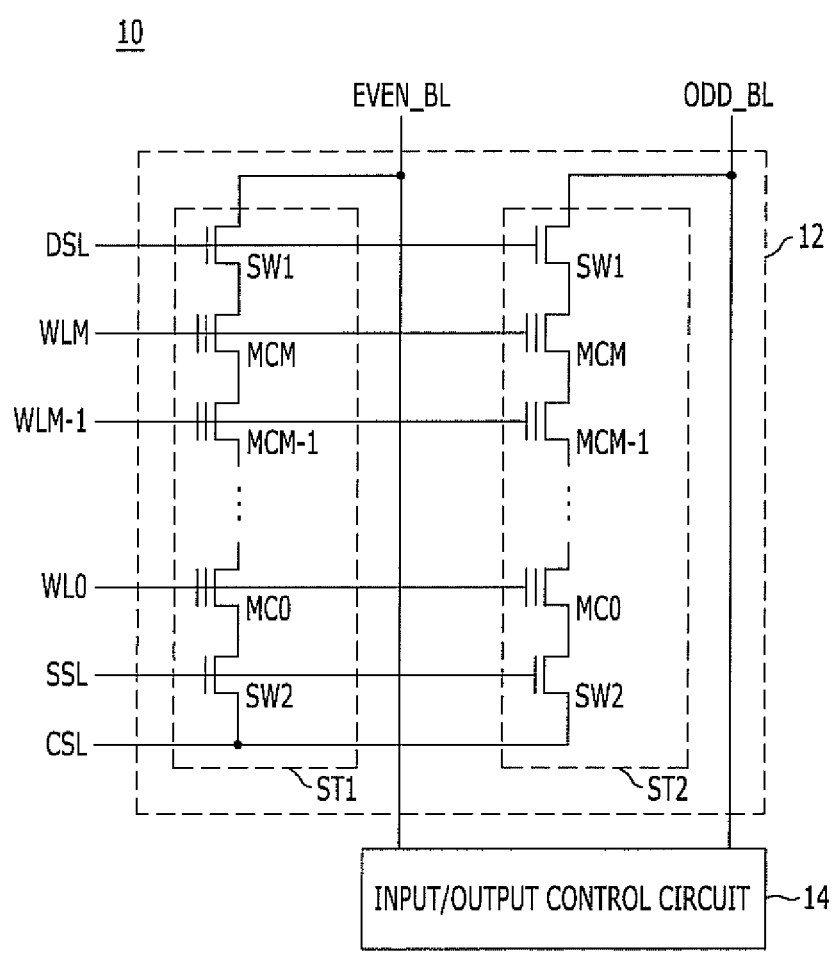
FIG. 1 is a schematic view illustrating a conventional non-volatile semiconductor memory device.
Figure 2A:
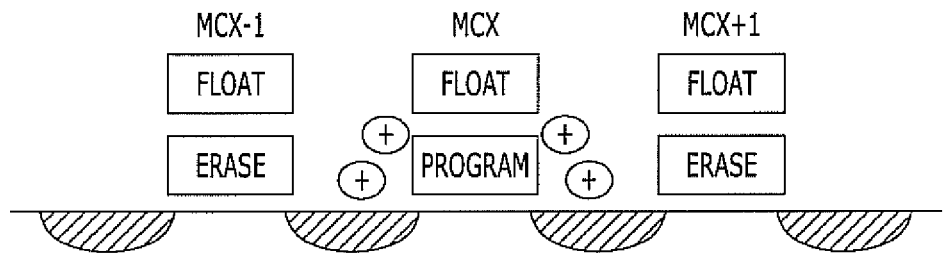
FIGS. 2A to 2D are explanatory diagrams illustrating concerns of the non-volatile semiconductor memory device shown in FIG. 1.
Figure 2B:
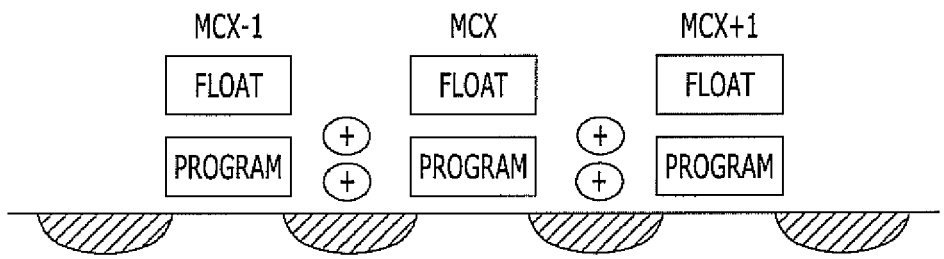
Figure 2C:
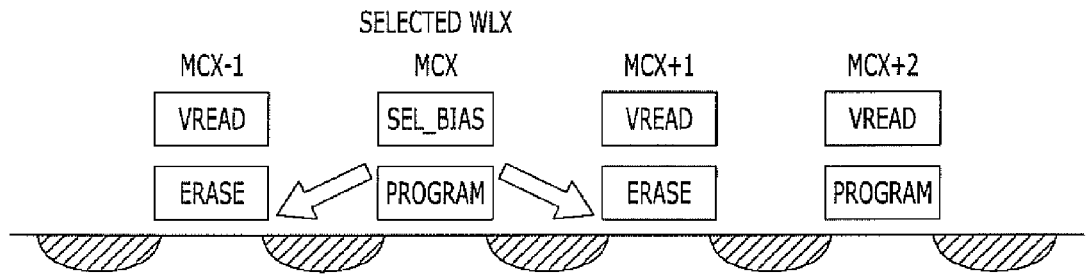
Figure 2D:
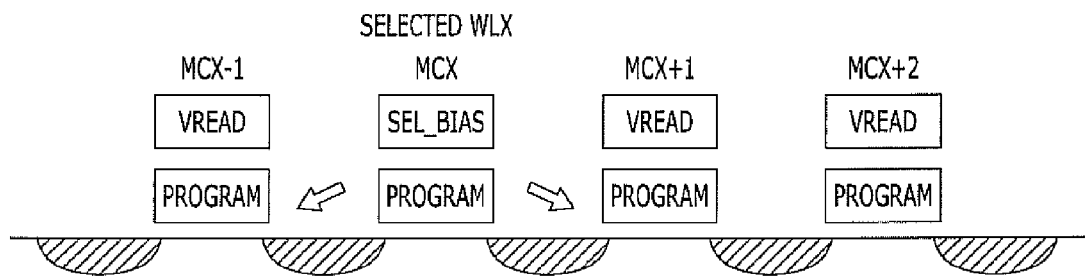

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

An embodiment of the present invention is described by taking a structure where two bit lines share one page buffer as an example. For the sake of convenience in description, the two bit lines and one page buffer are described hereafter.

Figure 3:
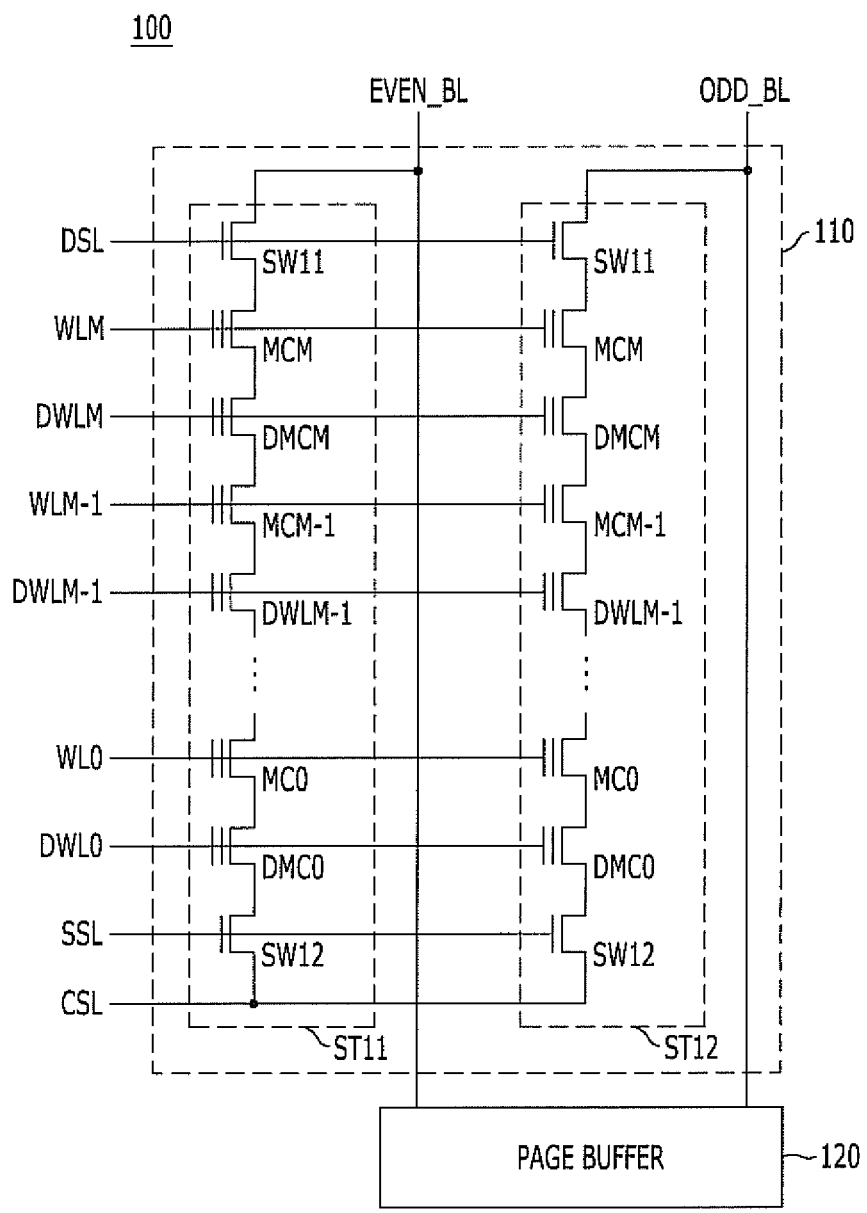
FIG. 3 is a schematic view illustrating a non-volatile semiconductor memory device in accordance with an embodiment of the present invention.

FIG. 3 is a schematic view illustrating a non-volatile semiconductor memory device in accordance with an embodiment of the present invention.

Referring to FIG. 3, the non-volatile semiconductor memory device 100 includes a memory cell array 110, and a page buffer 120. The memory cell array 110 programs data, which are transferred through a first bit line EVEN_BL and a second bit line ODD_BL, or provides programmed data through the first bit line EVEN_BL and the second bit line ODD_BL. The page buffer 120 selects any one of the first bit line EVEN_BL and the second bit line ODD_BL during a program operation or a read operation.

The memory cell array 110 includes a first cell string ST11 and a second cell string ST12. The first cell string ST11 has its one end coupled with the first bit line EVEN_BL and the other end coupled with a common source line CSL. The second cell string ST12 has its one end coupled with the second bit line ODD_BL and the other end coupled with the common source line CSL. Since the first cell string ST11 and the second cell string ST12 are formed of the same structure, only the first cell string ST11 is described herein, for the sake of convenience. The first cell string ST11 includes a first switch SW11 and a second switch SW12, respectively disposed on both ends, and a plurality of normal memory cells MC0 to MCM and a plurality of dummy memory cells DMC0 to DMCM which are disposed in series between the first switch SW11 and the second switch SW12. The normal memory cells MC0 to MCM and the dummy memory cells DMC0 to DMCM are alternately disposed. For example, starting from the normal memory cell MCM, the normal memory cells MC0 to MCM and the dummy memory cells DMC0 to DMCM are alternately coupled with each other. The dummy memory cell DMC0 comes at the end of the alternate serial connection of the normal memory cells MC0 to MCM and the dummy memory cells DMC0 to DMCM. The normal memory cells MC0 to MCM refer to memory cells that are programmed with a system firmware data and perform only a read operation without an erase operation. The dummy memory cells DMC0 to DMCM refer to memory cells that are programmed with dummy data always and are not read out during a read operation. The normal memory cells MC0 to MCM are coupled with a plurality of normal word lines WL0 to WLM in one-on-one. The dummy memory cells DMC0 to DMCM are coupled with a plurality of dummy word lines DWL0 to DWLM in one-on-one. Also, the first switch SW11 is coupled with a drain selection line DSL. The first switch SW11 selectively couples the memory cell MCM, disposed in one end with the first bit line EVEN_BL, according to the voltage level of the drain selection line DSL. The second switch SW12 is coupled with a source selection line SSL. The second switch SW12 selectively couples the dummy memory cell DMC0, disposed in the other end with the common source line CSL, according to the voltage level of the source selection line SSL.

Meanwhile, since the page buffer 120 is a widely known technology, detailed description on the page buffer 120 is omitted herein.

Hereafter, the operation of the non-volatile semiconductor memory device 100 in accordance with the embodiment of the present invention having the above-described structure is described with reference to FIG. 4. It is assumed that each of the first cell string ST11 and the second cell string ST12 includes 32 normal memory cells MC0 to MC31 and 32 dummy memory cells DMC0 to DMC31.

Figure 4:
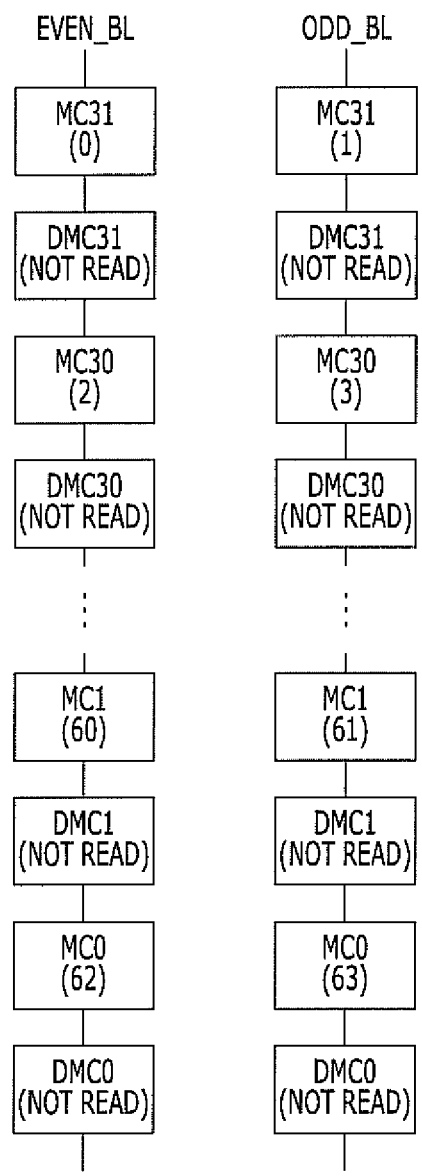
FIG. 4 illustrates a reading method of the non-volatile semiconductor memory device shown in FIG. 3.

FIG. 4 illustrates a reading method of a non-volatile semiconductor memory device in accordance with an embodiment of the present invention.

Referring to FIG. 4, while the first to $32^{nd}$ normal memory cells MC0 to MC31 included in each of the first cell string ST11 and the second cell string ST12 are programmed with the system firmware data, when the $32^{nd}$ normal memory cell MC31 is selected and the page buffer 120 selects the first bit line EVEN_BL, the data programmed in the $32^{nd}$ normal memory cell MC31 is read. For example, a read voltage SEL_BIAS, which is lower than a read pass voltage VREAD to be described later, is applied to the selected $32^{th}$ normal memory cell MC31; and the read pass voltage VREAD, which is higher than a threshold voltage VT of the first to $31^{st}$ normal memory cells MC0 to MC30 and the first to $32^{th}$ dummy memory cells DMC0 to DMC31, is applied to the unselected first to $31^{st}$ word lines WL0 to WL30 and the first to $32^{th}$ dummy memory cells DMC0 to DMC31. Subsequently, data are sequentially read in the order shown in FIG. 4 (0→1→2→3→ . . . →60→61→62→63) based on a combination of the first to $32^{nd}$ word lines WL0 to WL31 and the first and second bit lines EVEN_BL and ODD_BL. Herein, the first to $32^{th}$ dummy memory cells DMC0 to DMC31 are not read.

In other words, the reading method of the non-volatile semiconductor memory device 100 in accordance with the embodiment of the present invention includes: a first process of selecting a normal memory cell to be read among the first to $32^{th}$ normal memory cells MC0 to MC31; and a second process of applying a read voltage to a selected normal memory cell and applying a read pass voltage to the unselected normal memory cells and the first to $32^{th}$ dummy memory cells DMC0 to DMC31. The first and second processes are repeatedly performed for each of the remaining normal memory cells to be read; but, the first and second processes are not performed for the first to $32^{th}$ dummy memory cells DMC0 to DMC31. Meanwhile, when the first and second processes are repeatedly performed, they are sequentially performed in the zigzag order onto the normal memory cells MC0 to MC31 included in the first cell string ST11 and the second cell string ST12.

According to the embodiment of the present invention, since a dummy memory cell programmed with a dummy data is located between the normal memory cells of a cell string, the retention characteristics at a high temperature. The read disturbance characteristics may be improved. As a result, the operation reliability and stability of the non-volatile semiconductor memory device may be improved.

While the present invention has been described with respect to the specific embodiments, it will be apparent to those skilled in the art that various changes and modifications may be made without departing from the spirit and scope of the invention as defined in the following claims.

For example, although a case where a memory cell disposition order of a cell string starts from a normal memory cell and ends with a dummy memory cell is taken as an example to describe the embodiment of the present invention, the scope and spirit of the present invention are not limited to the case. The cell string may have a different memory cell disposition order according to operation characteristics and design. In other words, the cell string may have a memory cell disposition order starting from a normal memory cell and ending with a normal memory cell; the cell string may have a memory cell disposition order starting from a dummy memory cell and ending with a normal memory cell; or the cell string may have a memory cell disposition order starting from a dummy memory cell and ending with a dummy memory cell. If any, the structure where normal memory cells and dummy memory cells are alternately disposed is the same.

Also, although the embodiment of the present invention exemplarily describes a structure where two bit lines share one common page buffer, the scope and spirit of the present invention are not limited to it, and the technology of the present invention may be applied to a structure where one bit line is provided with one page buffer, too.

What is claimed is:

1. A non-volatile semiconductor memory device, comprising:
   at least one bit line; and
   a cell string unit coupled with the bit line and including normal memory cells and dummy memory cells that are alternately coupled with each other, wherein normal data are programmed to and read from the normal memory cells, while dummy data are programmed in dummy memory cells,
   wherein the numbers of the normal memory cells and the dummy memory cells included in the cell string unit are the same.

2. The non-volatile semiconductor memory device of claim 1, wherein the normal data include system firmware data.

3. The non-volatile semiconductor memory device of claim 1, wherein the cell string includes:
   a first switch for selectively coupling a memory cell disposed in one end of the cell string, which is one memory cell among the normal memory cells and the dummy memory cells, with a bit line in response to a first selection signal; and
   a second switch for selectively coupling a memory cell disposed in the other end of the cell string, which is one memory cell among the normal memory cells and the dummy memory cells, with a common source line in response to a second selection signal.

4. The non-volatile semiconductor memory device of claim 1, wherein the cell string has a memory cell disposition order starting from a normal memory cell in one end of the cell string and ending with a dummy memory cell in the other end of the cell string.

5. The non-volatile semiconductor memory device of claim 1, wherein the cell string has a memory cell disposition order starting from a dummy memory cell in one end of the cell string and ending with a normal memory cells in the other end of the cell string.

6. The non-volatile semiconductor memory device of claim 1, wherein the cell string has a memory cell disposition structure where the dummy memory cells are coupled with both ends of each of the normal memory cells.

7. The non-volatile semiconductor memory device of claim 1, wherein the cell string has a memory cell disposition structure where the normal memory cells are coupled with both ends of each of the dummy memory cells.

8. A non-volatile semiconductor memory device, comprising:
- a first cell string and a second cell strings, each including normal memory cells and dummy memory cells alternately coupled with each other, where normal data are programmed to and read from the normal memory cells while the dummy data are programmed in dummy memory cells;
- a first bit line coupled with one end of the first cell string;
- a second bit line coupled with one end of the second cell string;
- a common source line coupled with the other ends of the first and second cell strings in common; and
- a page buffer configured to select one of the first bit line and the second bit line,
- wherein the numbers of the normal memory cells and the dummy memory cells included in the first and second cell strings are the same.

9. The non-volatile semiconductor memory device of claim 8, wherein the normal data include system firmware data.

10. The non-volatile semiconductor memory device of claim 8, wherein each of the first and second cell strings includes:
- a first switch for selectively coupling a memory cell disposed in one end, which is one memory cell among the normal memory cells and the dummy memory cells, with the first bit line or the second bit line in response to a first selection signal; and
- a second switch for selectively coupling a memory cell disposed in the other end, which is one memory cell among the normal memory cells and the dummy memory cells, with the common source line in response to a second selection signal.

11. The non-volatile semiconductor memory device of claim 8, wherein the first and second cell strings have the same structure.

12. The non-volatile semiconductor memory device of claim 11, wherein each of the first and second cell strings has a memory cell disposition order starting from one of the normal memory cell and the dummy memory cell in one end and ending with the other of the normal memory cell and the dummy memory cell in the other end.

13. The non-volatile semiconductor memory device of claim 8, wherein each of the first and second cell strings has a memory cell disposition structure where the dummy memory cell is located between the normal memory cells and the normal memory cell is located between the dummy memory cells.

14. A reading method of a non-volatile semiconductor memory device having a cell string structure where normal memory cells for storing and providing normal data and dummy memory cells for storing dummy data are alternately disposed, comprising:
- performing a sequence of selecting one of the normal memory cells to be read, applying a read voltage to a selected normal memory cell, and applying a read pass voltage to unselected normal memory cells and the dummy memory cells, while each of the normal memory cells, not the dummy memory cells, outputs stored data,
- wherein the sequence is performed from a normal memory cell disposed in one end of a cell string to a normal memory cell disposed in the other end of the cell string.

15. The reading method of claim 14, wherein when the non-volatile semiconductor memory device has a structure where the first bit line and the second bit line are coupled with one page buffer in common,
- the selecting of the normal memory cell to be read and the applying of the read voltage to the selected normal memory cell and the applying of the read pass voltage to the unselected normal memory cells and the dummy memory cells are performed in a zigzag order onto the normal memory cells of the cell string coupled with the first bit line and the second bit line.

16. A non-volatile semiconductor memory device, comprising:
- a plurality of string units, each for storing multi-bit data, wherein the string unit comprises a plurality of normal cells and a plurality of dummy cells, each located between every two normal cells, connected in series to each other,
- wherein the numbers of the normal cells and the dummy cells are same with the bit-number of the multi-bit data.

17. The non-volatile semiconductor memory device of claim 16, wherein the normal cells in each string unit sequentially outputs stored data through a bit line.

* * * * *